(12) United States Patent
Ikumo et al.

(10) Patent No.: US 6,734,042 B2
(45) Date of Patent: May 11, 2004

(54) SEMICONDUCTOR DEVICE AND METHOD FOR FABRICATING THE SAME

(75) Inventors: Masamitsu Ikumo, Kawasaki (JP); Hirohisa Matsuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/207,815

(22) Filed: Jul. 31, 2002

(65) Prior Publication Data
US 2003/0162320 A1 Aug. 28, 2003

(30) Foreign Application Priority Data
Feb. 27, 2002 (JP) ........................................ 2002-051929

(51) Int. Cl.⁷ ............................................... H01L 21/44
(52) U.S. Cl. ....................................................... 438/118
(58) Field of Search ................................... 438/106, 108, 438/118, 455, 456

(56) References Cited
U.S. PATENT DOCUMENTS
6,281,450 B1 * 8/2001 Urasaki et al. ............. 174/261

OTHER PUBLICATIONS
Patent Abstract of Japan, Publication No. 08064938A. dated Mar. 8, 1996.

* cited by examiner

Primary Examiner—David A. Zarneke
Assistant Examiner—Scott B. Geyer
(74) Attorney, Agent, or Firm—Armstrong, Kratz, Quintos, Hanson & Brooks, LLP (57) ABSTRACT

A group of wires that bonds the first semiconductor chip and the second semiconductor chip together and extends on the first semiconductor chip is formed of a single plated film through plating in one continuous process. The second semiconductor chip is then bonded onto the first semiconductor chip to complete a semiconductor package.

8 Claims, 11 Drawing Sheets

SEMICONDUCTOR DEVICE AND METHOD FOR FABRICATING THE SAME

CROSS-REFERENCE TO RELATED APPLICATIONS

This application is based upon and claims priority of Japanese Patent Application No. 2002-051929, filed on Feb. 27, 2002, the contents being incorporated herein by reference.

BACKGROUND OF THE INVENTION

1. Field of the Invention

The present invention relates to a semiconductor device having a layer structure with one semiconductor chip bonded to another, and a method for fabricating the semiconductor device.

2. Description of the Related Art

Recent years have seen semiconductor devices in a package structure with semiconductor chips being stacked in layers to increase packing density and a technique for layering semiconductor chips in the form of wafers. In this case, first, wires are formed on the elements of a wafer to ensure electrical connections with those semiconductor chips to be stacked thereon, and then the semiconductor chip are stacked on the wafer and bonded to the elements. The semiconductor chip to be bonded is connected to the wire formed on the wafer through the use of gold wires, solder bumps, or gold bumps.

However, the aforementioned layering method comprises separate steps of forming wires on the semiconductor chip of the wafer and layering another semiconductor chip to be implemented on the semiconductor chip of the wafer. This makes the fabrication process complicated, resulting in an increase in turnaround time and in manufacturing costs. It is also necessary to apply a pressure at high temperatures to both the semiconductor chips when bonded together. This in turn causes the pressure to be exerted on the wire or circuit underlying the terminal of the chip, possibly leading to degradation in transmission characteristics due to a break or distortion in the wire. In particular, these disadvantages conceivably appear when a porous insulating material, the demand for which will grow increasingly, is used as an interlayer insulating film for wires within the semiconductor element.

SUMMARY OF THE INVENTION

The present invention was developed in view of the aforementioned problems. It is therefore an object of the present invention to provide a semiconductor device having semiconductor chips stacked in layers and a method for fabricating the semiconductor device. The highly reliable semiconductor device provides a simplified manufacturing process and a reduced turnaround time, thereby reducing costs and easily ensuring prevention of breaks in wires and improvement in transmission characteristics.

As a result of intensive studies, the present inventor has reached the following embodiments of the invention as described below.

The invention is directed to a semiconductor device having a composite structure with a first semiconductor chip being bonded to a second semiconductor chip.

The semiconductor device according to the invention includes a single electrically conductive film that electrically connects between the first semiconductor chip and the second semiconductor chip and extends on the element-formed surface of the first semiconductor chip.

The method for fabricating a semiconductor device according to the invention includes the steps of: temporarily fixing a first semiconductor chip and a second semiconductor chip with their element-formed surfaces being placed opposite to each other; and forming a single electrically conductive film that electrically connects between the first semiconductor chip and the second semiconductor chip and extends on the element-formed surface of the first semiconductor chip.

For example, it is preferable to employ a plating method to form the electrically conductive film with the first semiconductor chip and the second semiconductor chip being temporarily fixed and thereby retained relative to each other without applying a pressure therebetween.

DETAILED DESCRIPTION OF THE PREFERRED EMBODIMENTS

Now, the present invention will be explained below in more detail with reference to the accompanying drawings in accordance with the preferred embodiment to which the invention is applied.

In this embodiment, disclosed are the configuration of a semiconductor device (semiconductor package) having one semiconductor chip bonded to another and a method for fabricating the semiconductor device. For purposes of simplicity, the configuration of the semiconductor package is explained herein following its steps for fabricating the package.

FIGS. 1A to 9B are schematic views illustrating the steps of the method for fabricating the semiconductor package according to the embodiment in the order in which they appear, A series being a plan view and B series being a cross-sectional view, respectively.

Figure 1A:
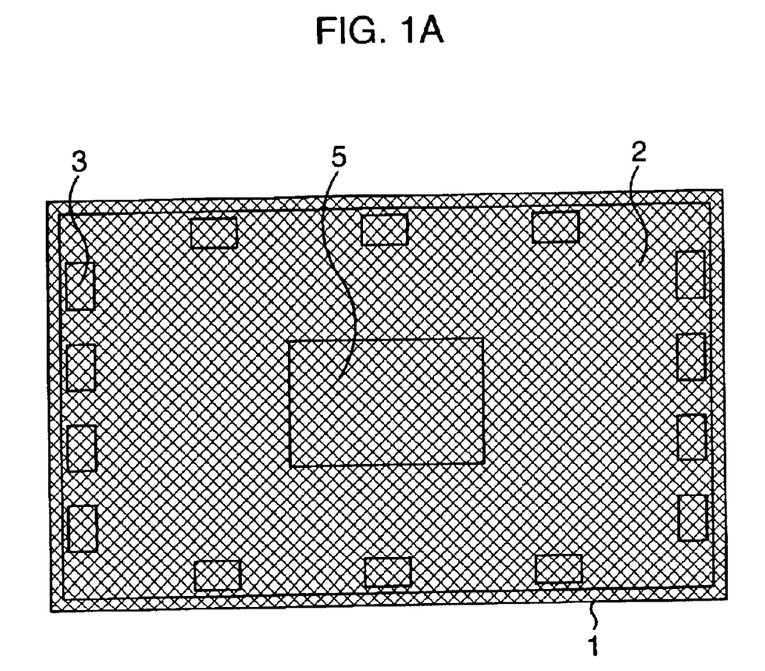
FIGS. 1A and 1B are schematic views illustrating steps of a method for fabricating a semiconductor package according to an embodiment in the order in which they appear.
Figure 1B:
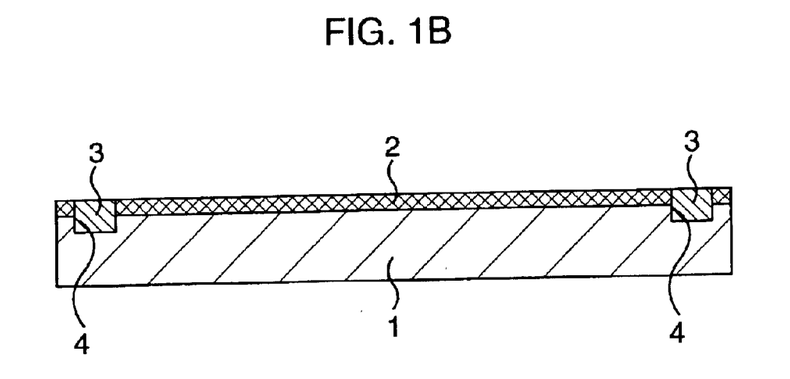

First, as shown in FIGS. 1A and 1B, an insulating film 2 of polyimide or the like is formed on a semiconductor substrate 1 of silicon.

Then, at each element-formed portion 11 of a first semiconductor chip on the semiconductor substrate 1, the insulating film 2 is ablated through photolithography and subsequent dry etching to form each groove 4. An electrically conductive material is then deposited to fill in the groove 4 and then polished flat such as by chemical mechanical polishing (CMP), thereby forming a plurality of pad electrodes 3 that fill in the groove 4.

Then, at a portion on the insulating film 2 which is surrounded by the pad electrodes 3 and to which a second semiconductor chip is bonded, an opening portion 5 is formed through photolithography and subsequent dry etching.

Figure 2A:
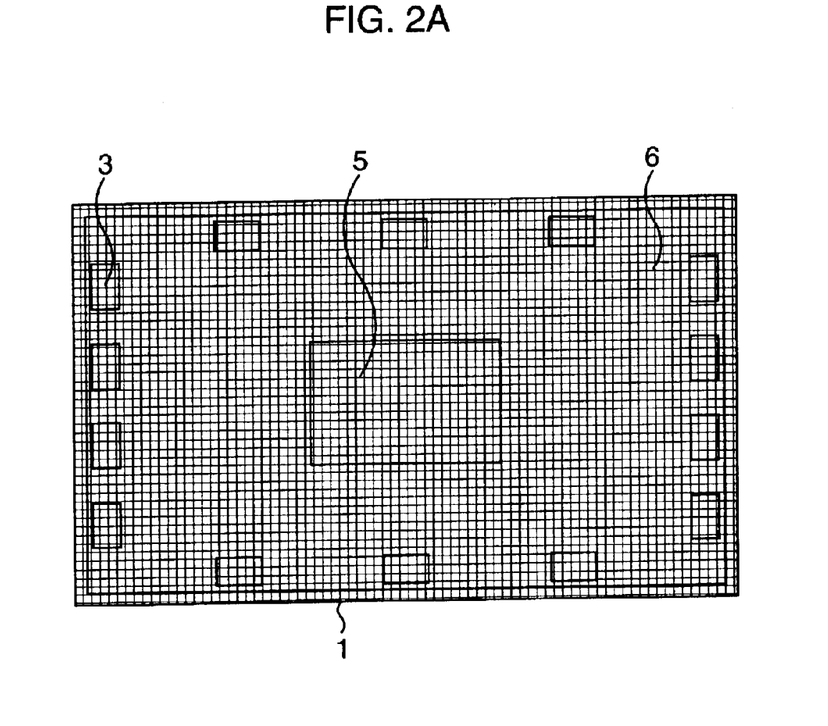
FIGS. 2A and 2B are schematic views illustrating steps of the method for fabricating the semiconductor package according to the embodiment in the order in which they appear subsequent to those of FIGS. 1A and 1B.
Figure 2B:
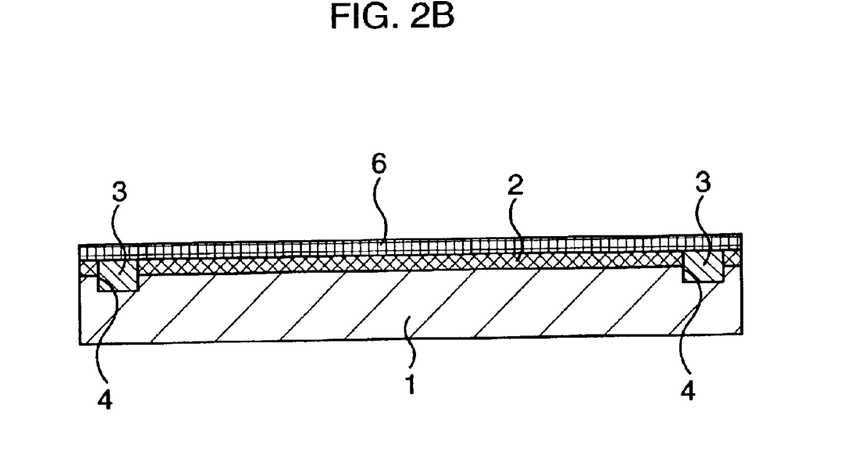

Then, as shown in FIGS. 2A and 2B, an electrically conductive layer 6, described later, which is to serve as a power supply electrode upon electroplating, is formed on the semiconductor substrate 1 through vapor deposition, sputtering, or by laminating a metal foil. For the lamination, an adhesive used for the lamination acts as an insulating material. At this time, since a radio frequency (RF) treatment or the like is not required, it is not necessary to remove the insulating film 2 at the portion of the element-formed portion 11 to which the second semiconductor chip, described later, is bonded.

When sputtering is employed to form the conductive layer 6, it is preferable to form the conductive layer 6 in a multi-layer structure that includes a metal film providing a good adhesion to the insulating film 2 and a metal film having a good electrical property, the films being stacked in layers. When polyimide is used for the insulating film, metals such as Cr or Ti may be used as the metal providing a good adhesion to the insulating film, while metals such as Cu may be used as the metal having a good electrical property.

Then, the second semiconductor chip is bonded to the element-formed portion 11 of each first semiconductor chip while patterned wires are formed on the element-formed portion 11 of each first semiconductor chip on the conductive layer 6.

Figure 3A:
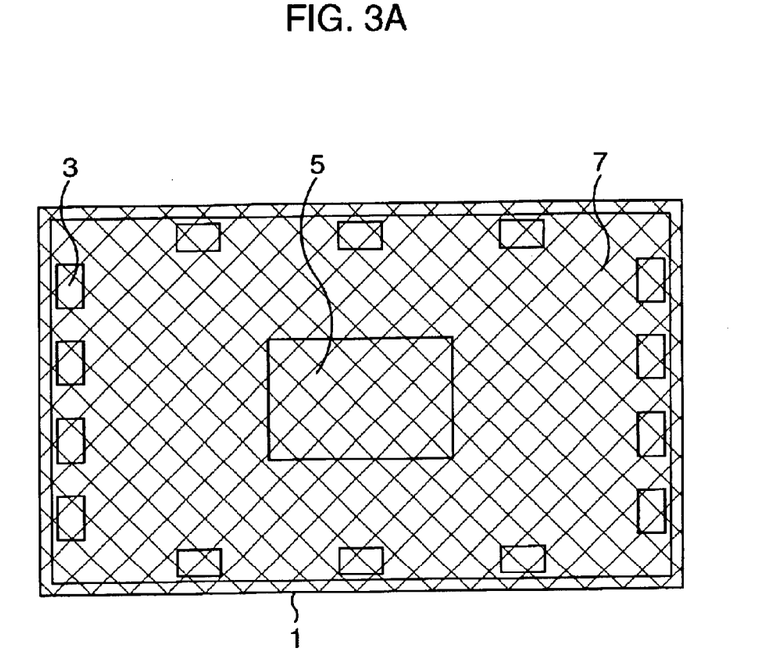
FIGS. 3A and 3B are schematic views illustrating steps of the method for fabricating the semiconductor package according to the embodiment in the order in which they appear subsequent to those of FIGS. 2A and 2B.
Figure 3B:
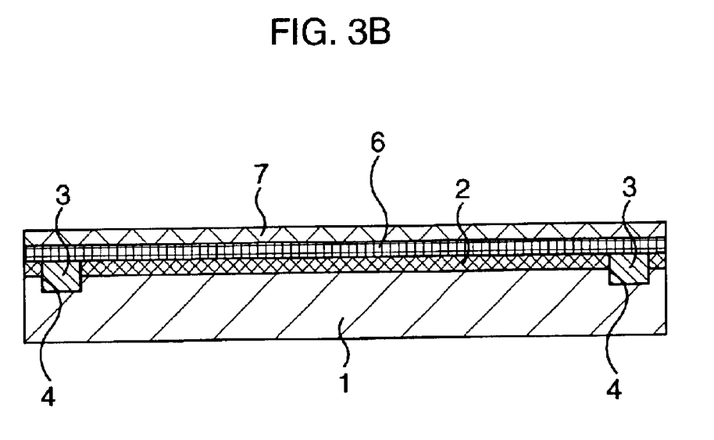
Figure 4A:
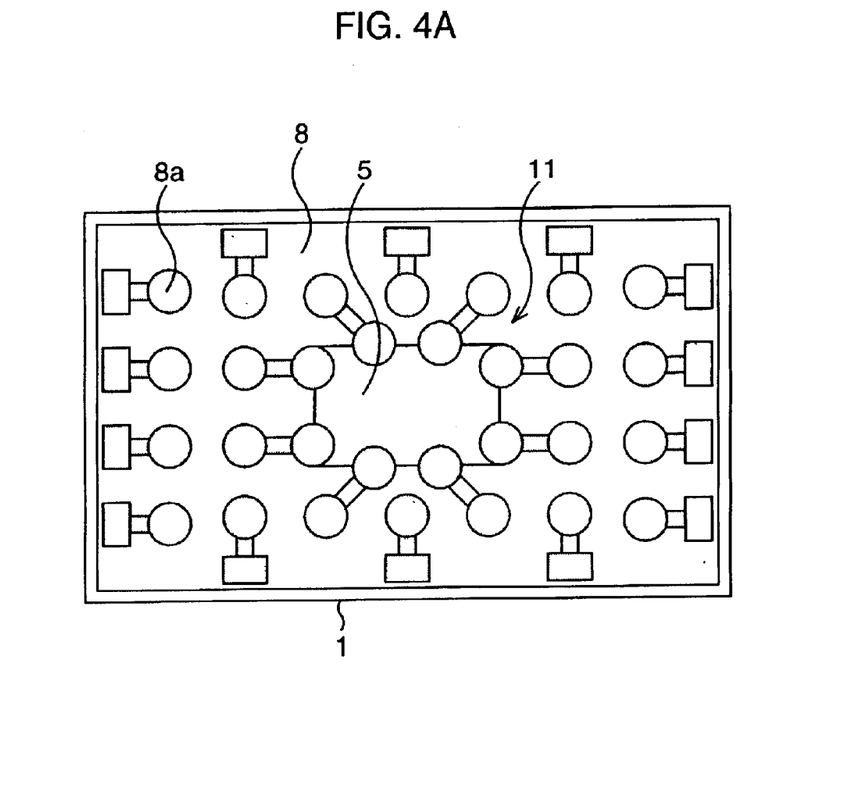
FIGS. 4A and 4B are schematic views illustrating steps of the method for fabricating the semiconductor package according to the embodiment in the order in which they appear subsequent to those of FIGS. 3A and 3B.
Figure 4B:
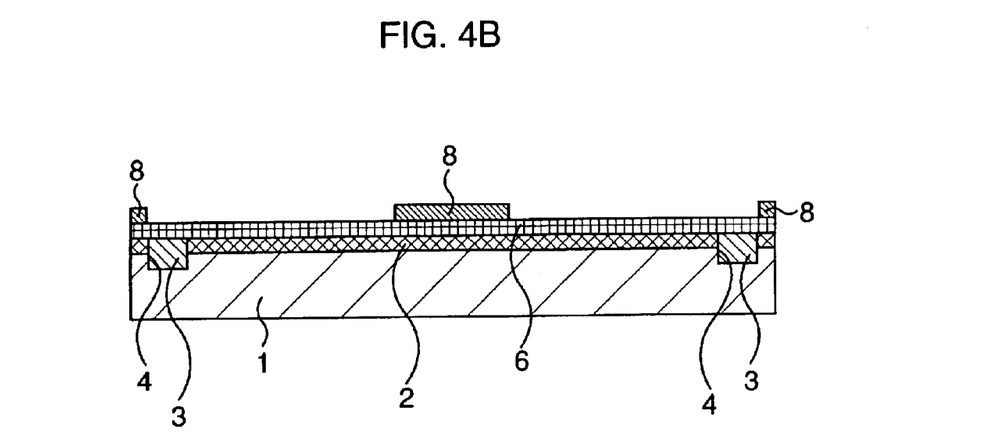

More specifically, as shown in FIGS. 3A and 3B, photoresist 7 is first coated on the conductive layer 6. Then, as shown in FIGS. 4A and 4B, the photoresist 7 is ablated through photolithography to form a patterned resist 8 having an opening 8a that is exposed through the surface of the conductive layer 6 in the shape of the wires.

Then, a second semiconductor chip 12 is connected to the element-formed portion 11 of each first semiconductor chip.

Figure 5A:
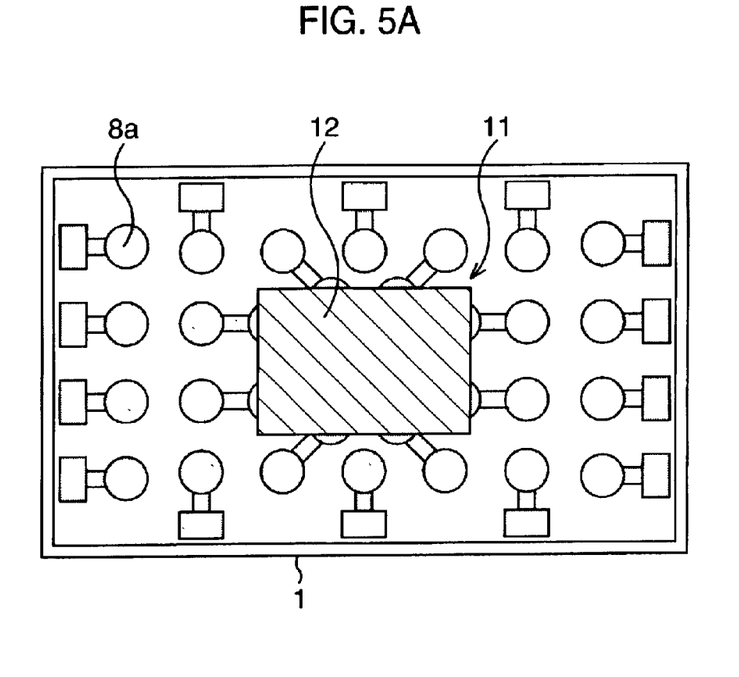
FIGS. 5A and 5B are schematic views illustrating steps of the method for fabricating the semiconductor package according to the embodiment in the order in which they appear subsequent to those of FIGS. 4A and 4B.
Figure 5B:
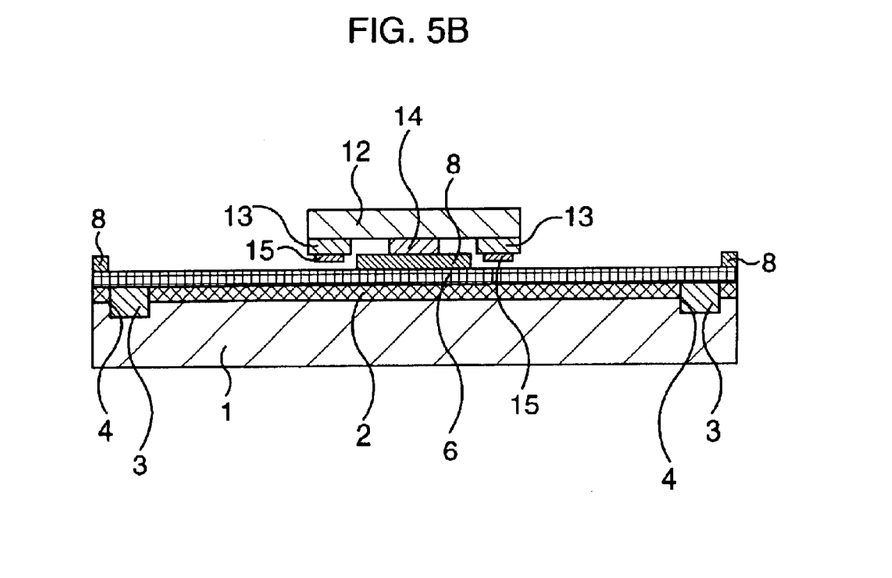

As shown in FIGS. 5A and 5B, the second semiconductor chip 12 has a predetermined semiconductor element fabricated thereon, and is provided with pad electrodes 13 bonded to the first semiconductor chip and adhesive resin 14 used for temporary fixation. The pad electrode 13 is provided with bumps 15 in advance about 30 µm in height.

The second semiconductor chip 12 is placed oppositely in alignment with the element-formed portion 11 of each first semiconductor chip and the opening portion 5 of the insulating film 2. The adhesive resin 14 is bonded to the patterned resist 8 on the element-formed portion 11, thereby fixing temporarily the second semiconductor chip 12 to the element-formed portion 11 of the first semiconductor chip.

For example, electroplating is conducted at temperatures of 50 to 80° C. using the conductive layer 6 provided on the element-formed portion 11 of the first semiconductor chip as a power supply electrode. For example, a plated film formed by the electroplating includes a layer such as a copper (Cu) layer provided in consideration of electrical properties, a nickel (Ni) layer acting as a barrier metal, and a gold (Au) layer providing a good adhesion to external connection terminals. The Cu layer in the plated film may not be provided so long as the electrical properties can be ensured only with the conductive layer 6.

Figure 6A:
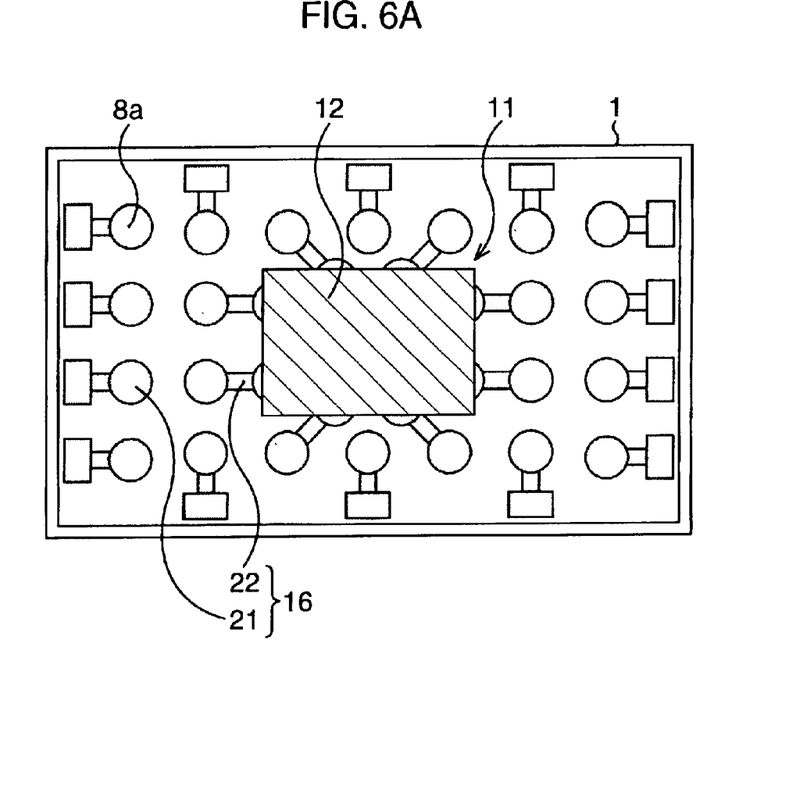
FIGS. 6A and 6B are schematic views illustrating steps of the method for fabricating the semiconductor package according to the embodiment in the order in which they appear subsequent to those of FIGS. 5A and 5B.
Figure 6B:
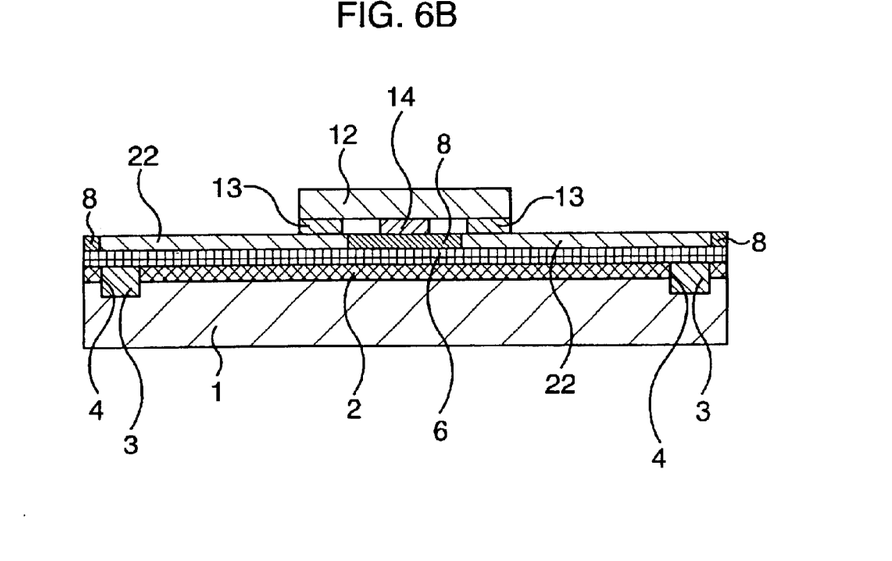

As shown in FIGS. 6A and 6B, through the electroplating, the opening of the patterned resist 8 is filled, and a plated film is formed to cover the bumps 15 provided on the pad electrodes 13 of the second semiconductor chip 12. The plated film serves as a single plated film that provides for a group of wires 16, which includes lead wires 21 and 22 that are formed after the shape of the opening of the patterned resist 8. The lead wire 21 is connected to the pad electrode 3, while the lead wire 22 covers the bumps 15 near the second semiconductor chip 12 to electrically connect the second semiconductor chip 12 to the element-formed portion 11 of the first semiconductor chip.

Figure 7A:
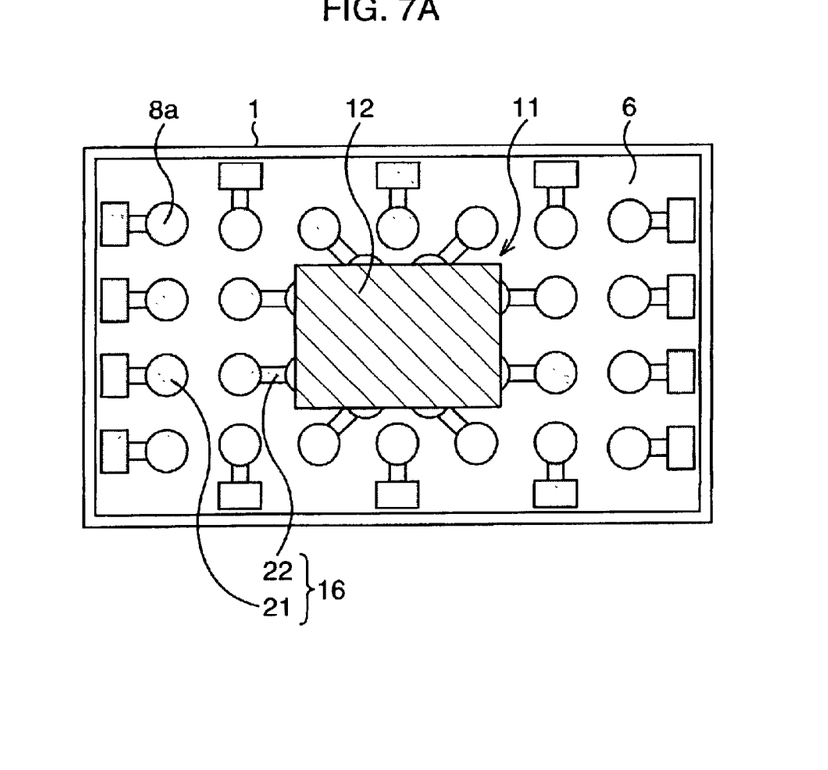
FIGS. 7A and 7B are schematic views illustrating steps of the method for fabricating the semiconductor package according to the embodiment in the order in which they appear subsequent to those of FIGS. 6A and 6B.
Figure 7B:
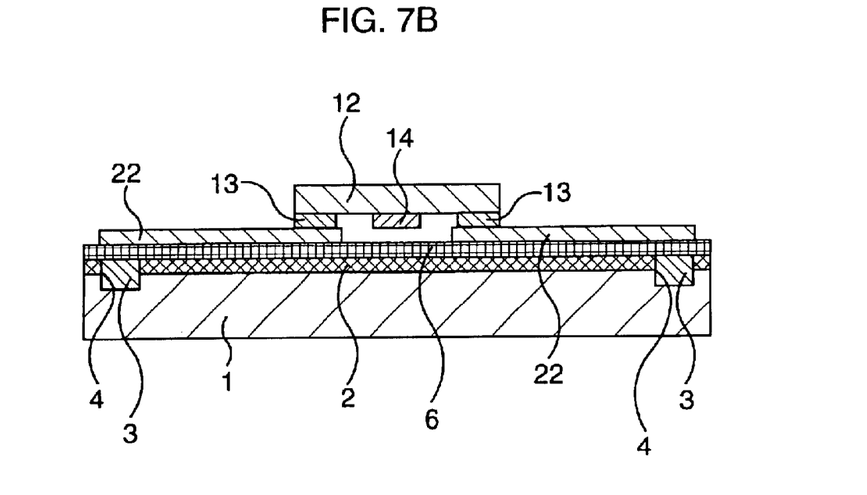

Then, as shown in FIGS. 7A and 7B, the patterned resist 8 is removed by ashing or the like. In this step, for example, the adhesive resin 14 adhered to the patterned resist 8 remains on the second semiconductor chip 12.

Figure 8A:
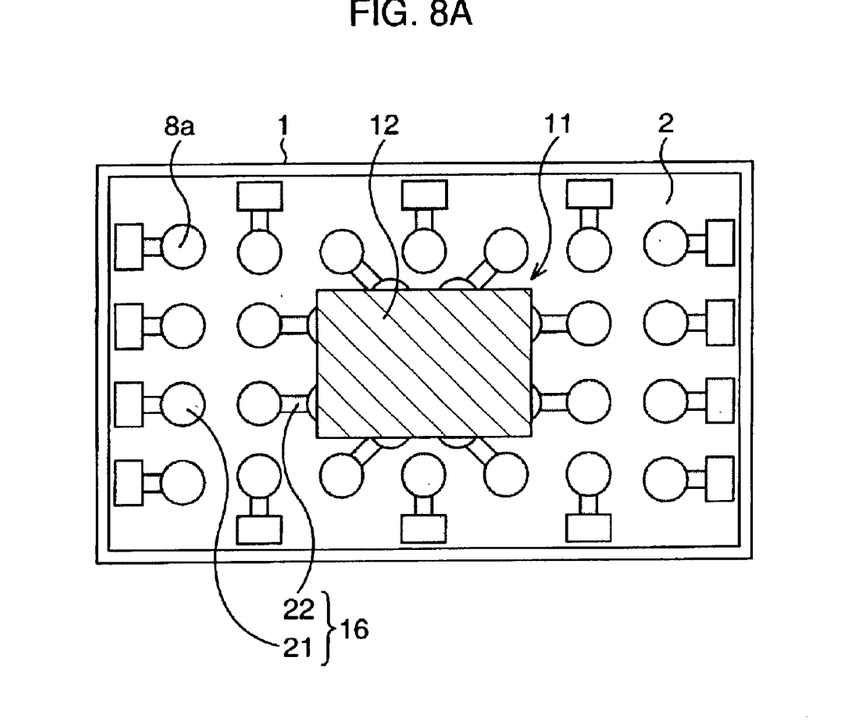
FIGS. 8A and 8B are schematic views illustrating steps of the method for fabricating the semiconductor package according to the embodiment in the order in which they appear subsequent to those of FIGS. 7A and 7B.
Figure 8B:
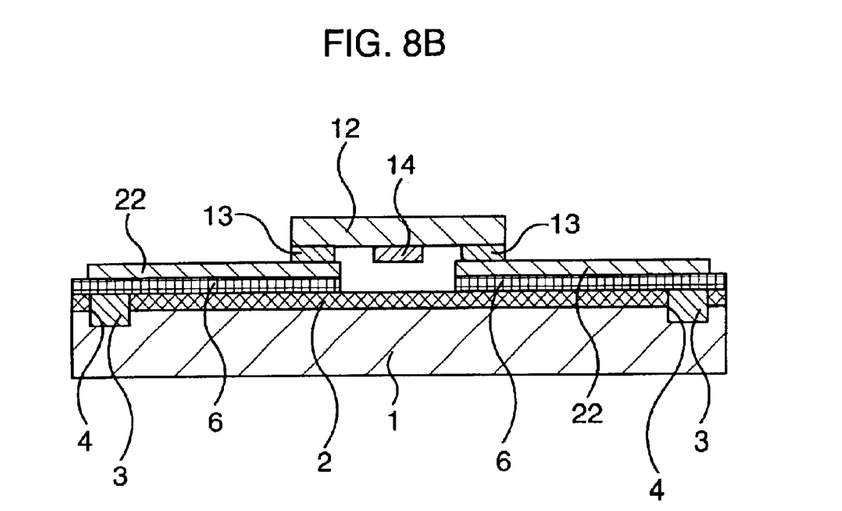

Then, as shown in FIGS. 8A and 8B, the conductive layer 6 underlying the patterned resist 8 is removed. Since it is necessary to remove the conductive layer 6 at a portion corresponding to one underlying the second semiconductor chip 12, the conductive layer 6 is removed through wet etching.

Figure 9A:
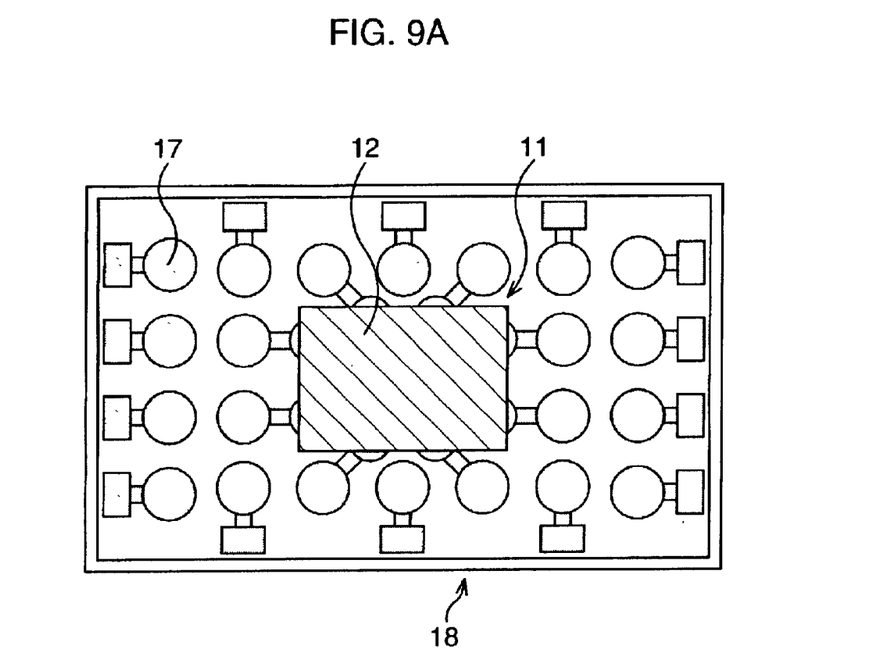
FIGS. 9A and 9B are schematic views illustrating steps of the method for fabricating the semiconductor package according to the embodiment in the order in which they appear subsequent to those of FIGS. 8A and 8B.
Figure 9B:
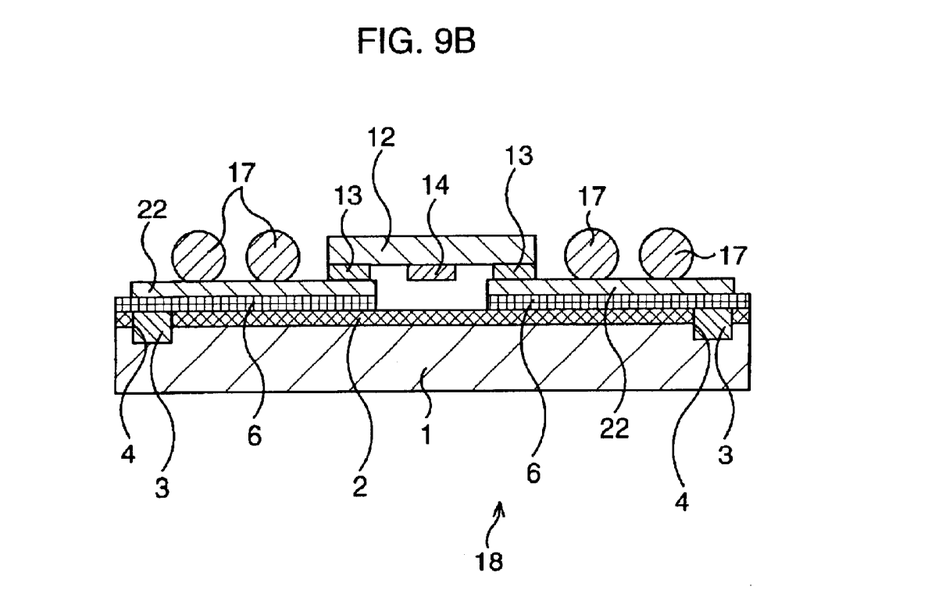

Then, as shown in FIGS. 9A and 9B, for example, solder balls are provided at terminal-formed portions 21a, 22a of each of the lead wires 21, 22 to form external connection terminals 17. Then, the semiconductor substrate 1 is cut, thereby providing a complete semiconductor package in which the group of wires 16 having the external connection terminals 17 is formed on the insulating film 2 and the lead wire 22 bonds the second semiconductor chip 12 to the first semiconductor chip 18.

Figure 11A:
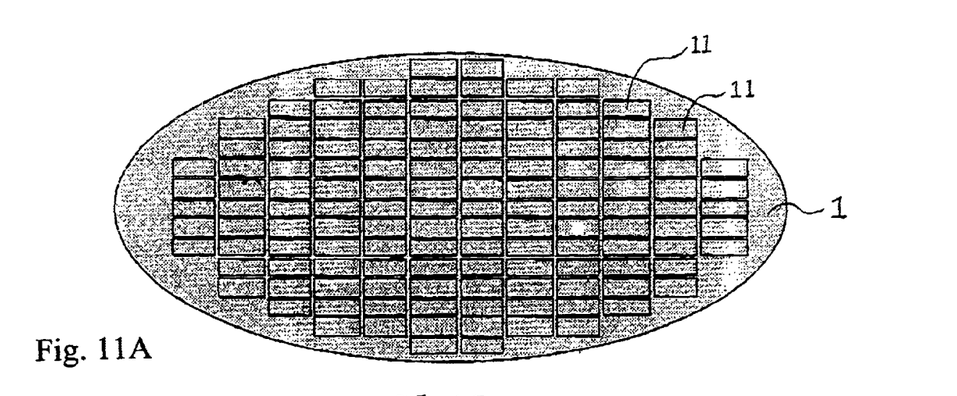
FIG. 11A is a schematic view illustrating a semiconductor substrate 1, on which a plurality of element-formed portions are formed, which are to be cut from the semi conductor substrate to form semiconductor chips.
Figure 11B:
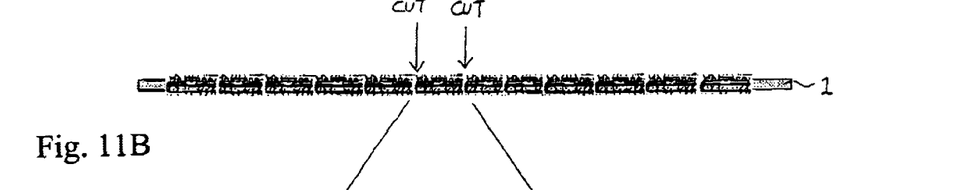
FIG. 11B is a schematic cross-sectional view of the semi-conductor substrate of FIG. 11A.
Figure 11C:
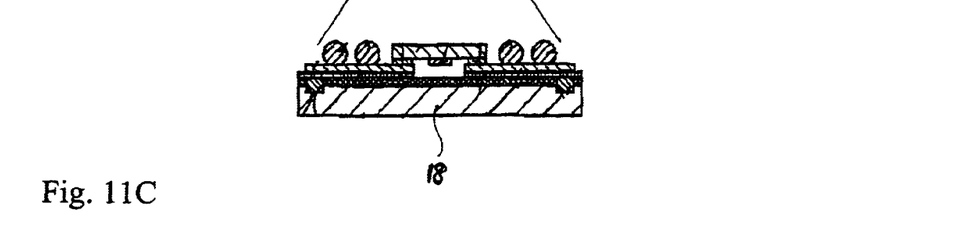
FIG. 11C is a schematic cross-sectional view of a semiconductor chip 18 having been cut from the semiconductor substrate 1.

FIGS. 11A–11C show element-formed portions 11 on semiconductor substrate 1, which are cut from the substrate to form semiconductor chips 18.

In this embodiment, the electroplating is used to form the aforementioned plated film, however, the electroless plating may also be employed. In this case, the conductive layer 6 or the power supply electrode is not required. Employing the electroless plating to form the plated film would cause an unnecessary sidewall to be formed along the edges of the lead wires 21, 22 upon forming the group of wires 16. The sidewall is therefore removed after the second semiconductor chip 12 has been bonded to the element-formed portion 11 of the first semiconductor chip.

As described above, according to this embodiment, the group of wires 16 that bonds the first semiconductor chip 18 and the second semiconductor chip 12 together and extends on the first semiconductor chip 18 is formed of a single plated film through plating in one continuous process. This makes it possible to bond the second semiconductor chip 12 to the first semiconductor chip 18 at relatively low temperatures without applying a pressure therebetween. Accordingly, this makes it possible to simplify the manufacturing process and reduce the turnaround time, thereby reducing costs. This also makes it possible to prevent damage (break) to the microstructure such as the lead wires 21, 22 and damage to the insulating film 2, thereby providing a semiconductor package that readily ensures the improvement of transmission characteristics.

MODIFIED EXAMPLE

Now, a modified example of this embodiment is explained below. Like the aforementioned embodiment, this modified example also discloses a semiconductor package having one semiconductor chip bonded onto another, but is slightly different in what manner both the semiconductor chips are bonded together.

Figure 10A:
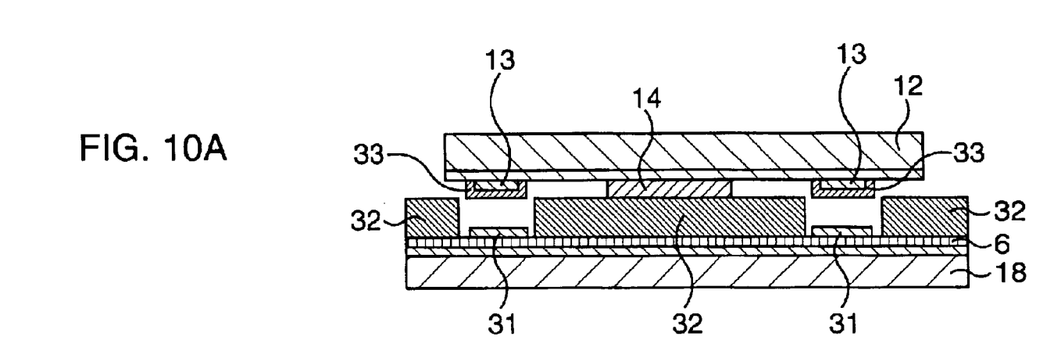
FIGS. 10A to 10C are schematic cross-sectional views illustrating only main steps of a method for fabricating a semiconductor package according to a modified example of the embodiment.
Figure 10B:
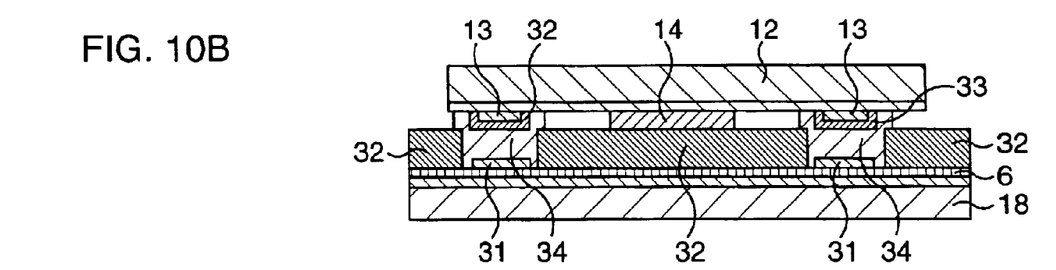
Figure 10C:
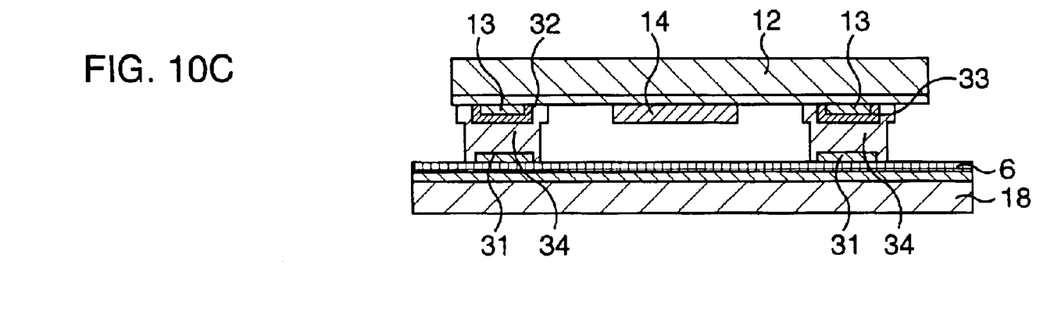

FIGS. 10A, 10B, and 10C are schematic cross-sectional views illustrating only main steps of a method for fabricating a semiconductor package according to the modified example of the embodiment.

First, generally the same steps as those of FIGS. 1A to 4B of the embodiment are performed. In these steps, unlike the embodiment, connection pad electrodes 31 are formed on the conductive layer 6 that serves as a power supply electrode upon performing electroplating on the semiconductor substrate 1, and a patterned resist 32 is formed so as to provide an opening for exposing at least the pad electrodes 31, as shown in FIG. 10A.

Then, the second semiconductor chip 12 is connected to the element-formed portion 11 of each first semiconductor chip.

The second semiconductor chip 12 has a predetermined semiconductor element fabricated thereon, and is provided with the pad electrode 13 bonded to the first semiconductor chip and the adhesive resin 14 used for temporary fixation. The pad electrode 13 is provided with a bump 15 in advance so as to cover the pad electrode 13.

The second semiconductor chip 12 is placed oppositely in alignment with the element-formed portion 11 of each first semiconductor chip. The adhesive resin 14 is bonded to the patterned resist 32 on the element-formed portion 11, thereby fixing temporarily the second semiconductor chip 12 to the element-formed portion 11 of the first semiconductor chip.

Then, electroplating is conducted at temperatures of 50 to 80° C. using the conductive layer 6 provided on the element-formed portion 11 of the first semiconductor chip as a power supply electrode. A plated film formed by the electroplating includes a layer such as a copper (Cu) layer provided in consideration of electrical properties, a nickel (Ni) layer acting as a barrier metal, and a gold (Au) layer providing a good adhesion to external connection terminals. The Cu layer in the plated film may not be provided so long as the electrical properties can be ensured only with the conductive layer 6.

As shown in FIG. 10B, through the electroplating, the opening of the patterned resist 32 is filled, and a single plated film of wires 34 is formed to cover each of upper and lower bumps 13, 33.

Then, as shown in FIG. 10C, the patterned resist 32 is removed by ashing or the like. In this step, for example, the adhesive resin 14 adhered to the patterned resist 32 remains on the second semiconductor chip 12.

Then, through the steps such as of removing the unnecessary conductive layer 6 and forming external connection terminals using solder balls, a semiconductor package is completed.

As described above, according to the modified example, the wires 34 that bond the first semiconductor chip 18 and the second semiconductor chip 12 together are formed of a single plated film through plating in one continuous process. This makes it possible to bond the second semiconductor chip 12 to the first semiconductor chip 18 at relatively low temperatures without applying a pressure therebetween. Accordingly, this makes it possible to simplify the manufacturing process and reduce the turnaround time, thereby reducing costs. This also makes it possible to prevent damage (break) to the microstructure and damage to the insulating film 2, thereby providing a semiconductor package that readily ensures the improvement of transmission characteristics.

In a semiconductor device having semiconductor chips stacked in layers, implemented is the highly reliable semiconductor device that provides a simplified manufacturing process and reduced turnaround time, thereby realizing reduced manufacturing costs. The semiconductor device can also prevent breaks in the wires and readily ensure the improvement of transmission characteristics.

What is claimed is:

1. A method for fabricating a semiconductor device having a second semiconductor chip bonded to a first semiconductor chip, comprising the steps of:
   fixing an element-formed surface of the first semiconductor chip being formed on a semiconductor substrate and an element-formed surface of the second semiconductor chip, the element-formed surfaces being placed opposite to each other, and
   forming an electrically conductive film, extending on the element-formed surface of the first semiconductor chip, being formed, electrically connecting between the first semiconductor chip being formed and the second semiconductor chip, wherein
   said fixing comprises temporarily maintaining said opposite placement with use of an adhesive.

2. The method for fabricating a semiconductor device according to claim 1, wherein the conductive film is integrated with a lead wire of the first semiconductor chip being formed and a connecting portion to be connected with the second semiconductor chip.

3. The method for fabricating a semiconductor device according to claim 1, wherein the conductive film is formed with the first semiconductor chip being formed and the second semiconductor chip being fixed by the temporary use of the adhesive and thereby retained relative to each other without applying a pressure therebetween.

4. The method for fabricating a semiconductor device according to claim 1, wherein the conductive film is formed through plating.

5. The method for fabricating a semiconductor device according to claim 4, wherein the plating is electroplating or electroless-plating.

6. The method for fabricating a semiconductor device according to claim 1, wherein the fixing is carried out using an adhesive resin.

7. A method for fabricating a semiconductor device having a second semiconductor chip bonded to a first semiconductor chip, comprising the steps of:

fixing an element-formed surface of the first semiconductor chip being formed on a semiconductor substrate and an element-formed surface of the second semiconductor chip, the element-formed surfaces being placed opposite to each other, and forming a single electrically conductive film, extending on the element-formed surface of the first semiconductor chip being formed, electrically connecting between the first semiconductor chip being formed and the second semiconductor chin, wherein said fixing comprises temporarily maintaining said opposite placement with use of an adhesive, the conductive film is formed through plating, and the step of forming the conductive film includes the steps of:

forming a mask having an opening provided in a shape of the lead wire on the first semiconductor chip being formed, and forming the conductive film through plating to fill in the opening of the mask in order to connect the conductive film to the second semiconductor chip.

8. A method for fabricating semiconductor devices having second semiconductor chips bonded to first semiconductor chips, comprising the steps of:

fixing an element-formed surface of a plurality of first semiconductor chips being formed on a semiconductor substrate and an element-formed surface of a plurality of corresponding second semiconductor chips, the element-formed surfaces being placed opposite to each other, and forming a single electrically conductive film, extending on the element-formed surface of each first semiconductor chip being formed, electrically connecting between each first semiconductor chip being formed and each corresponding second semiconductor chip, wherein said fixing comprises temporarily maintaining said opposite placements with use of an adhesive.

* * * * *